United States Patent [19]
Diazzi et al.

[11] Patent Number: 5,883,547
[45] Date of Patent: Mar. 16, 1999

[54] CHARGING OF A BOOTSTRAP CAPACITANCE THROUGH AN LDMOS

[75] Inventors: Claudio Diazzi, Milan; Fabrizio Martignoni, Morazzone; Mario Tarantola, Milan, all of Italy

[73] Assignee: SGS-Thomson Microelectronics S.R.L., Italy

[21] Appl. No.: 644,449

[22] Filed: May 13, 1996

[30] Foreign Application Priority Data

May 17, 1995 [EP] European Pat. Off. ............. 95830207

[51] Int. Cl.⁶ .................................................. A02M 7/162
[52] U.S. Cl. .......................... 327/589; 327/427; 327/537; 327/390
[58] Field of Search .................................... 327/427, 325, 327/375, 378, 534, 537, 390, 589

[56] References Cited

U.S. PATENT DOCUMENTS

| | | | |
|---|---|---|---|
| 4,188,550 | 2/1980 | Lum | 327/514 |
| 4,346,310 | 8/1982 | Carter | 327/589 |
| 4,574,203 | 3/1986 | Baba | 327/291 |
| 5,138,200 | 8/1992 | Barsanti et al. | 326/88 |
| 5,321,313 | 6/1994 | Oberhauser | 327/427 |
| 5,365,118 | 11/1994 | Wilcox | 327/109 |
| 5,506,539 | 4/1996 | Kelly et al. | 327/427 |
| 5,650,737 | 7/1997 | Eilley | 327/427 |
| 5,742,196 | 4/1998 | Fronen et al. | 327/382 |

FOREIGN PATENT DOCUMENTS

| | | |
|---|---|---|
| 0367006 | 5/1990 | European Pat. Off. . |
| 94 27370 | 11/1994 | WIPO . |

*Primary Examiner*—Terry D. Cunningham
*Attorney, Agent, or Firm*—Allen, Dyer, Doppelt, Milbrath & Gilchrist, P.A.

[57] ABSTRACT

A charging circuit for a bootstrap capacitance employing an integrated LDMOS transistor and including a circuital device for preventing the turning on a parasitic transistors of the integrated LDMOS structure during transients that comprises a plurality of directly biased junctions (D1, D2, ..., Dn) connected in series between a source and a body of the LDMOS transistor structure and at least a current generator, tied to ground potential, coupled between said body and ground, has at least one switch (INT1) between said source and a first junction (D1) of said plurality of junctions and a limiting resistance (R) connected between the body and the current generator (GEN). The switch (INT1) is kept open during a charging phase of the bootstrap capacitance (Cboot) and is closed when the charge voltage (Vboot) of the bootstrap capacitance reaches a preset threshold. Moreover, the body voltage (VB) is prevented from exceeding the source voltage (VS) plus a Vbe, by controlling a discharge path (T2) with a control stage (T1, R1) in response to a drop of the voltage on the limiting resistance (R). This body voltage control circuit is enabled by a second switch (INT2) driven in phase with the first switch (INT1).

15 Claims, 6 Drawing Sheets

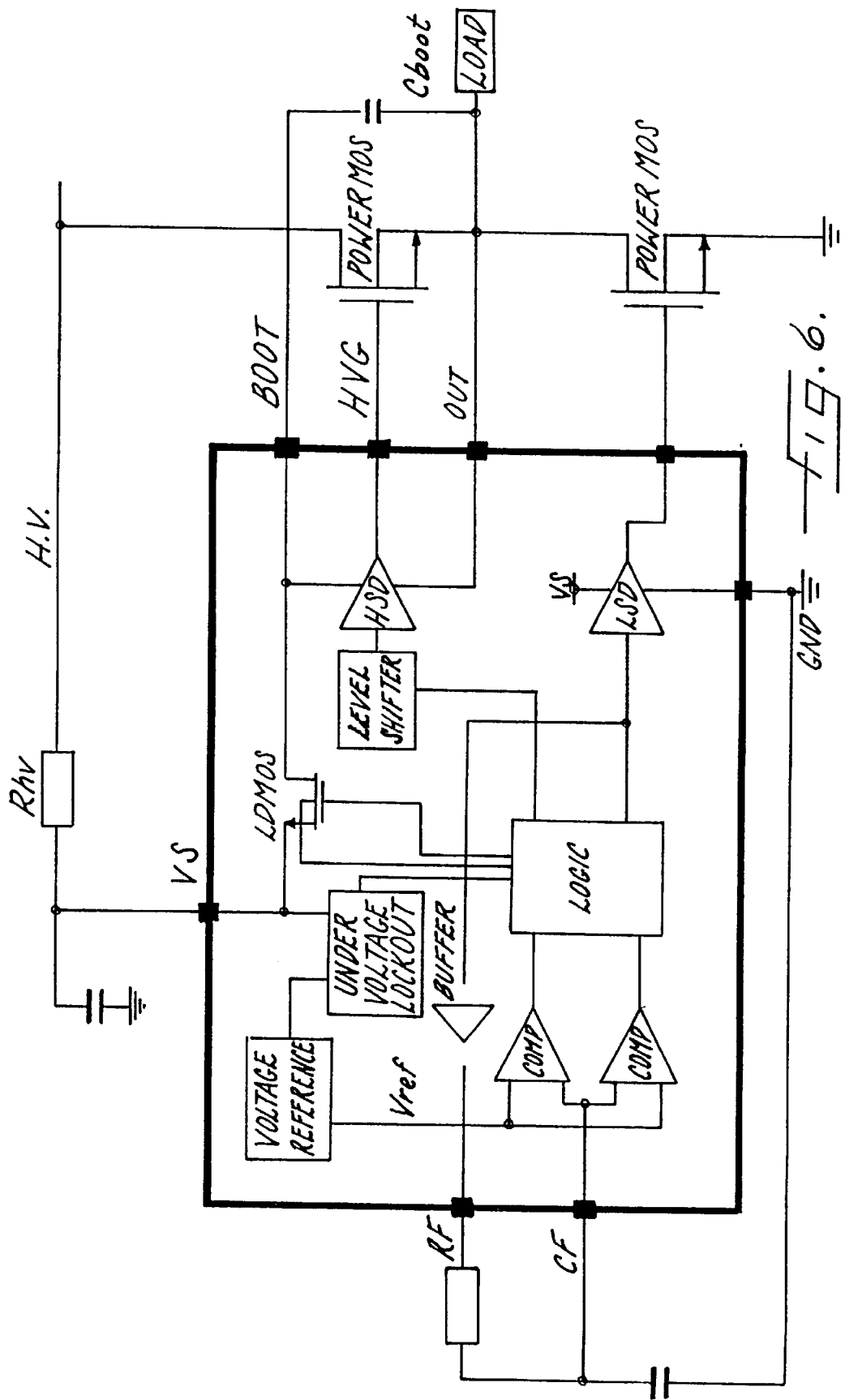

CHARGING OF A BOOTSTRAP CAPACITANCE THROUGH AN LDMOS

FIELD OF THE INVENTION

The present invention is concerned with integrated circuits and more in particular with driving circuits of power stages. The invention refers to a bootstrap system whereby the capacitance is charged through an LDMOS integrated transistor.

BACKGROUND OF THE INVENTION

In integrated circuits comprising output stages destined to drive discrete power devices or themselves integrated on the same chip containing the drive and control circuitry, it is common to employ bootstrap capacitance so as to ensure a correct supply of the driving stage of the power device. In this type of system, it is essential to ensure the charge of the bootstrap capacitance in a very short period of time, and it is also common to use an LDMOS transistor in order to rapidly charge the bootstrap capacitance.

In the specific case of a driving circuit destined for a so-called High Side Driver (HSD), e.g., which conventionally forms a portion of a driving stage to drive a power device and which conventionally also connects to a so-called Low Side Driver (LSD) which in turn connects to ground (GND), the LDMOS should be able to charge the bootstrap capacitance when the HSD is tied to the low voltage, that is when the output of the HSD is low. By contrast, when the HSD is tied to the high voltage, that is when the HSD output is high, the LDMOS should represent a high impedance. These operating conditions must be complied with even during the high-to-low voltage phase of commutation (or viceversa) of the HSD itself regardless of possible current injections originating from charging and discharging processes of capacitances associated with the integrated structure of the LDMOS that must with stand the high voltage supply of the power device.

In order to control the intrinsic parasitic effects of an integrated LDMOS structure, it is a well known practice to realize the integrated structure represented by the circuit shown in FIG. 1. Typically, the driving voltage VG for the gate of the integrated LDMOS is obtained from the VS source voltage by means of a charging pump.

As a matter of example, the driving stage refers to an HSD that is driven in a turn-on or turn-off mode by a certain control signal IN. The HSD output is also connected to an LSD which, in turn, is connected to GND as understood by those skilled in the art. The HSD supply, when referred to high voltage (Vhv), is assured by the bootstrap capacitance Cboot which is connected to a load (LOAD) as illustrated and as understood by those skilled in the art. Moreover, during this phase, the bootstrap capacitance Cboot loses the electric charge necessary to the charging and consumption of the HSD.

During the phase where the output (OUT) of the HSD is low, the charging transistor LDMOS is turned on so as to restore the electric charge absorbed from the bootstrap capacitance Cboot in the preceding phase.

The n diodes (or forward biased diodes) have the specific function of impeding the turning-on of the parasitic PNP during the dynamic operation of the circuit. As a matter of fact, if the structure is dimensioned in such a way that Vboot>VS=(n+1)Vbe, the parasitic transistor PNP can not turn on.

When turning on the circuit, and before commuting the HSD output, it is necessary to charge the initially uncharged bootstrap capacitance Cboot.

Referring back to the circuital scheme of FIG. 1, it can be noticed that when VS>nVbe, the body node of the LDMOS transistor is at a voltage that satisfies the condition VB=VS−nVbe. If the voltage VS of the source node continues to rise faster than the voltage Vboot of the charging bootstrap capacitance, the parasitic PNP of the LDMOS integrated structure turns on, driving all or part of the current toward the integrated circuit substrate rather than in the Cboot capacitance. This implies the risk of not achieving the charging of the bootstrap capacitance or in any case to obtain this in an excessively long period of time with a considerable waste of energy via the substrate.

Additional and more serious inconveniences may occur during the HSD commutation with this known type of circuit. This is due to the presence of a parasitic NPN associated with the integrated structure of the LDMOS.

If we consider the presence of the junction capacitance Cbd between the body and the drain as shown in FIG. 2, during the voltage rising front of the drain node of the LDMOS transistor, a current injection in the body occurs through the Cbd capacitance of the body-drain junction.

If due to such a current injection the body potential VB rises above the value: VS+Vbe, by considering the design condition whereby:

$$\text{Vboot} > \text{VS} - (n+1)\text{Vbe} \qquad (1)$$

the source-body junction is directly biased thus turning on the parasitic NPN transistor with the consequent destruction of the integrated component due to an extremely high power dissipation. This failure mechanism is very likely to occur since the body represents a high impedance node.

OBJECT AND SUMMARY OF THE INVENTION

This demonstrates the utility of a charging circuit of a bootstrap capacitance using an integrated transistor LDMOS that would assure a low consumption and high immunity toward the occurrence of conditions that may the cause the destruction of the integrated device.

This object is fully reached by the present invention which relates to a method and to an implementing circuit capable of assuring the interdiction of parasitic transistors and a minimization of current leakage under all operating conditions of the charging circuit of a bootstrap capacitance using an LDMOS integrated transistor. According to an embodiment of the invention, a switch interrupts the connection between the source node and the first junction of the drain of directly biased junctions that commonly exists between the source node and a current generator linked to the ground potential, during the charging phase of the bootstrap capacitance. The switch is turned off when the voltage of the charging bootstrap capacitance reaches a pre-established threshold. Furthermore, the current that may accidentally be injected by the triggering of a parasitic transistor is limited in any case by employing a limiting resistance between the body node of the LDMOS structure and the current generator itself, which is in turn linked to the circuit ground potential.

According to a further aspect of this invention, even a slight residual probability of the occurrence of conditions that would bring into a conductive state the parasitic NPN transistors; for example, an injection of current during a commutation phase, via the capacitance between drain and body, can be effectively eliminated by employing an appropriate circuit able to prevent the body voltage to rise above the source voltage plus a Vbe. This is achieved by establishing a discharge path of the body node that is enabled by a driving stage responsive to a voltage drop sensed across the above mentioned limiting resistance connected in series with the body. This switched discharge circuit is enabled by a second switch that can be controlled in phase with the first switch by a control circuit in function of the actual voltage present on the bootstrap capacitance.

BRIEF DESCRIPTION OF THE DRAWINGS

The various aspects and advantages of this invention will be more evident through the following description of some important though nonlimitative embodiments, and by referring to the annexed drawings, wherein:

FIG. 6 represents a block diagram of a device incorporating a driving circuit according to FIG. 5.

DESCRIPTION OF PREFERRED EMBODIMENTS

Figure 1:
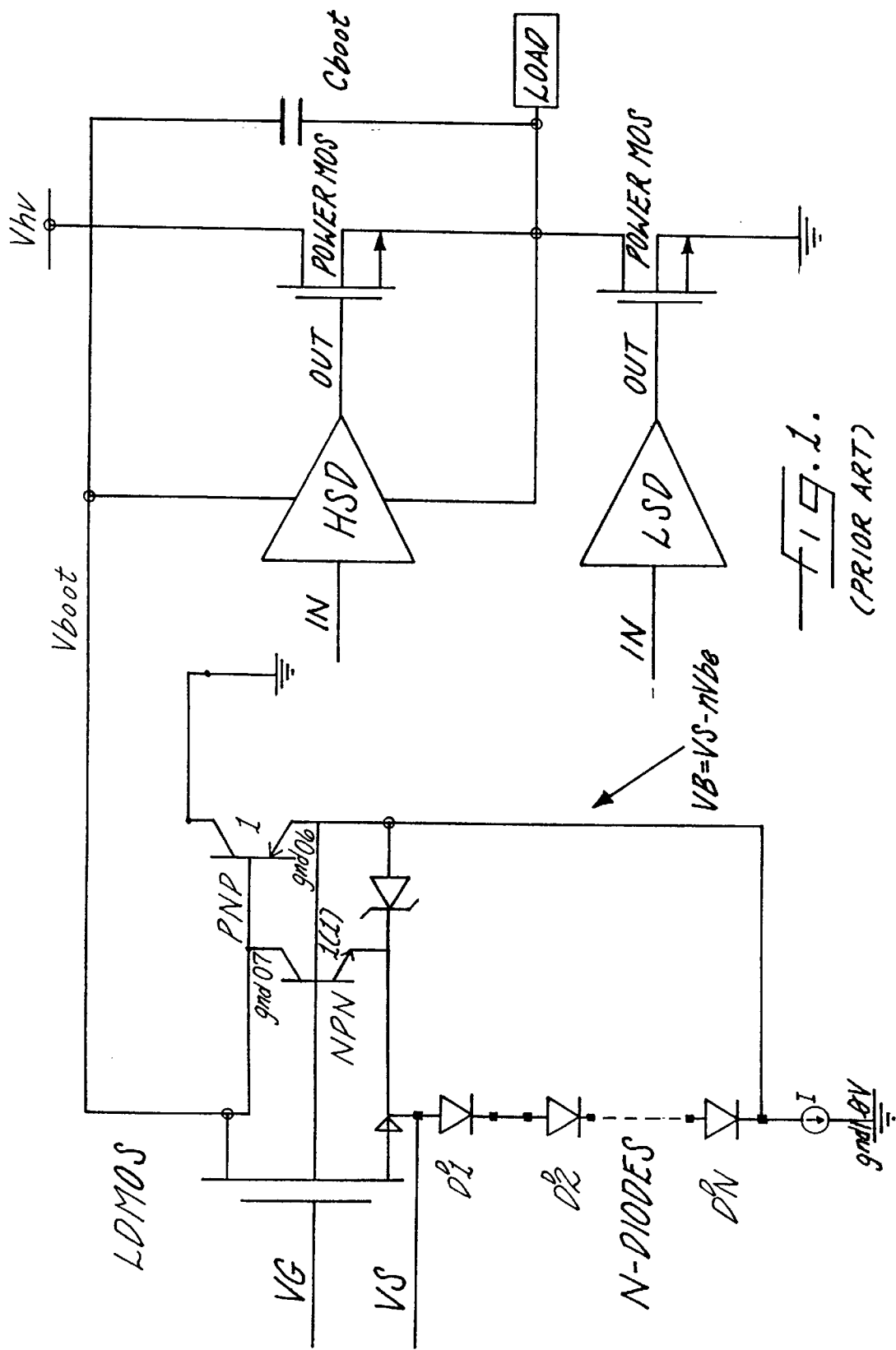
FIGS. 1 and 2 represent partial diagrams illustrating the problems associated with a charging circuit of a bootstrap capacitance, as previously mentioned.
Figure 2:
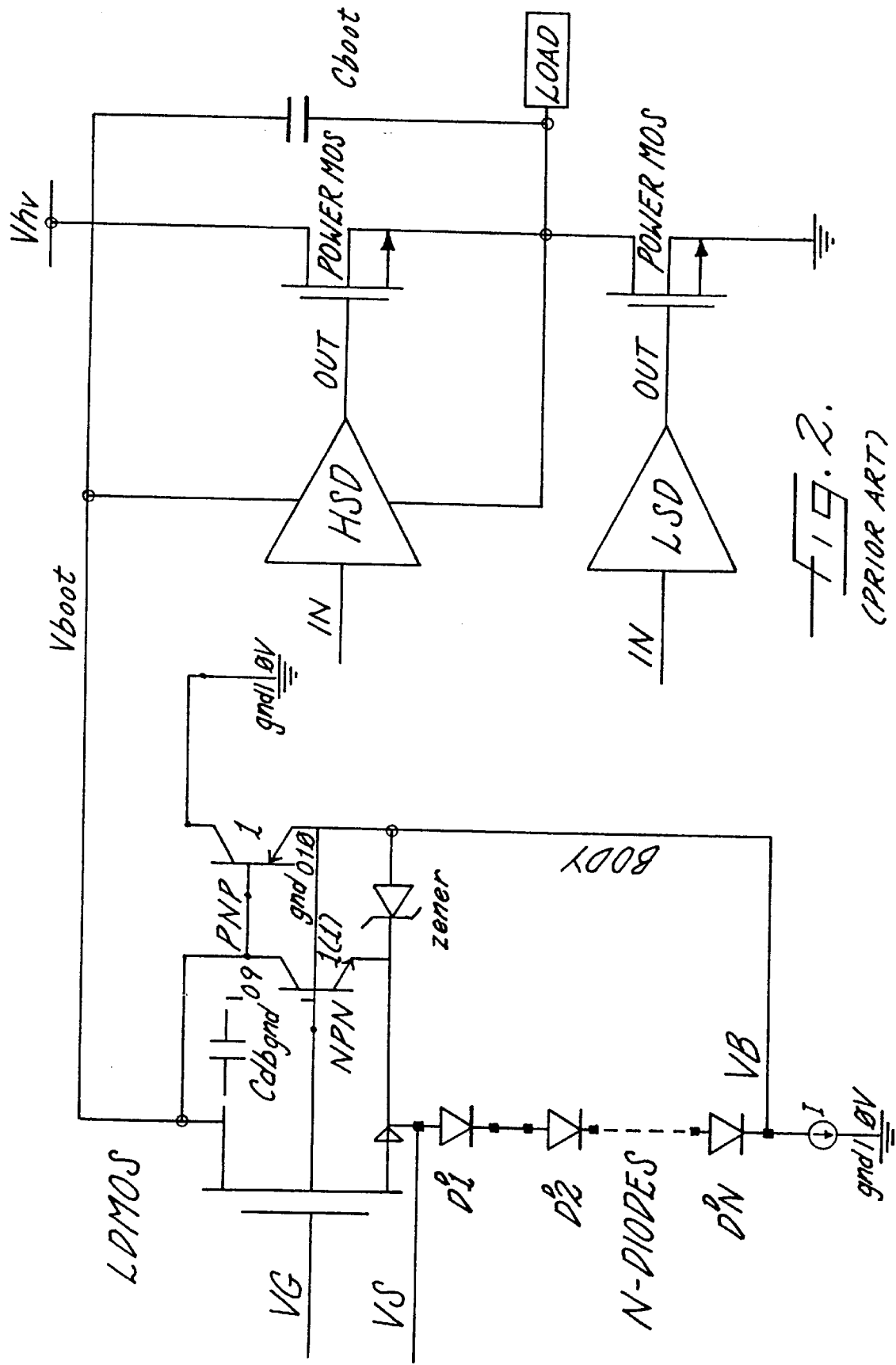
Figure 3:
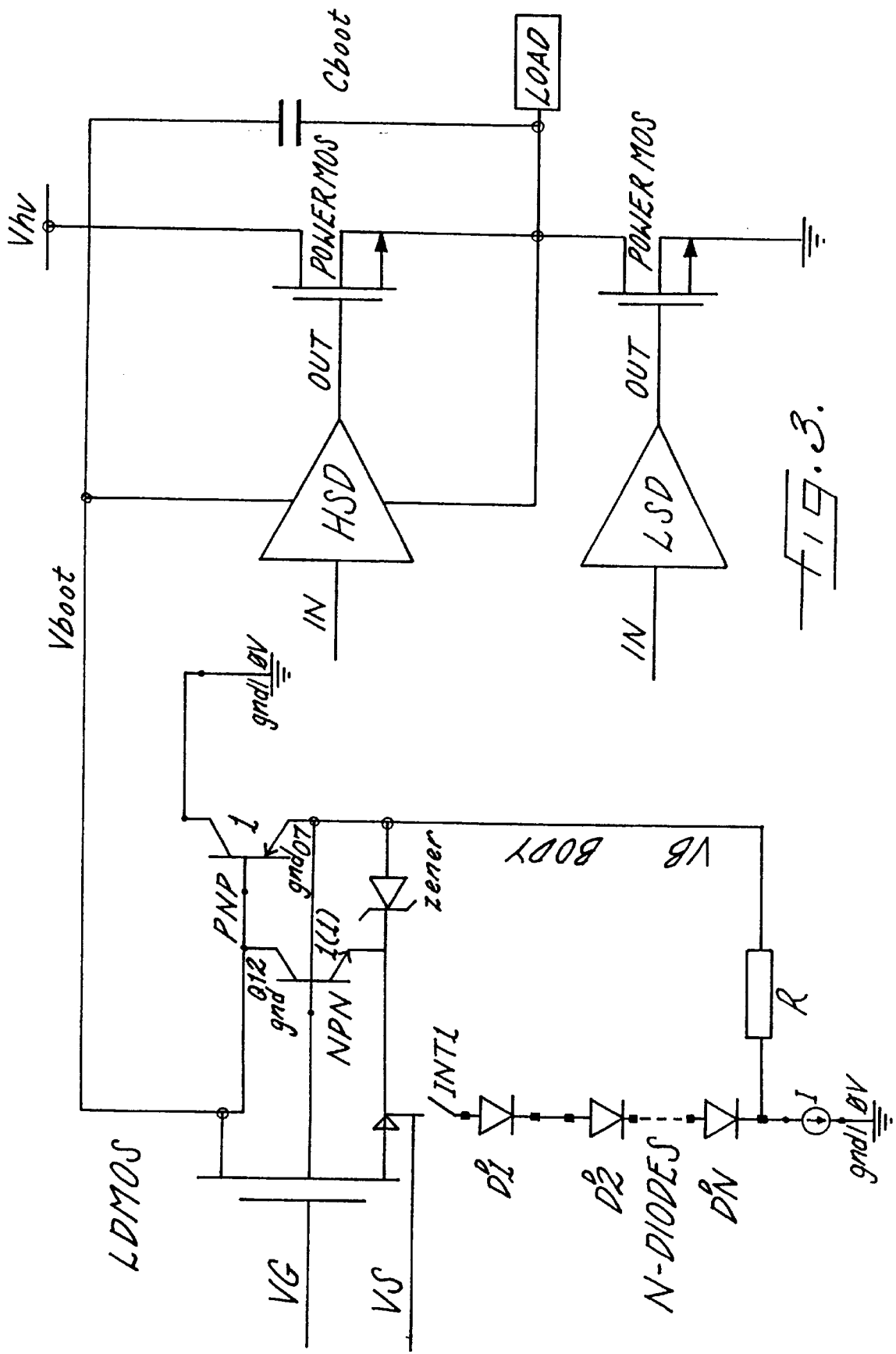
FIG. 3 is a basic diagram of a charging circuit according to a first embodiment of this invention.

Referring to FIG. 3, when charging for the first time the bootstrap capacitance Cboot, in order that during the charging transient the parasitic PNP transistor does not turn on, it is necessary to maintain the body of the charging LDMOS transistor, that in turn constitutes the PNP's emitter, at a potential as low as possible (in practice to ground potential) until the source voltage VS exceeds the breakdown voltage of the parasitic zener. However, this procedure diminishes the ability of delivery current of the charging transistor LDMOS due to the body effect (increase of its own threshold). Therefore, it is of paramount importance that, once the charging process ends, the LDMOS transistor body be brought to a higher voltage. This is obtainable by means of the switch INT1.

The INT1 switch is kept open during the charging of the bootstrap capacitance (Cboot).

When the voltage Vboot reaches a level that fulfills the expression:

$$\text{Vboot} > \text{VS} - (n+1)\text{Vbe} \tag{1}$$

the INT1 switch is closed and the voltage of the body node can rise up to a point of complying with the following condition:

$$\text{VB} = \text{VS} - n\text{VBE} \tag{2}$$

without causing the triggering of any parasitic transistor.

The resistance R, connected in series with the body functions as current limiter in the case where the above condition (1) can not be fulfilled due to accidental causes (noise) or otherwise whereby the switch INT1 turns off too early. In any case the consumption of current via the substrate that would be caused by the triggering-on the parasitic PNP transistor will be limited in function of the value of the limiting resistance R.

Figure 4:
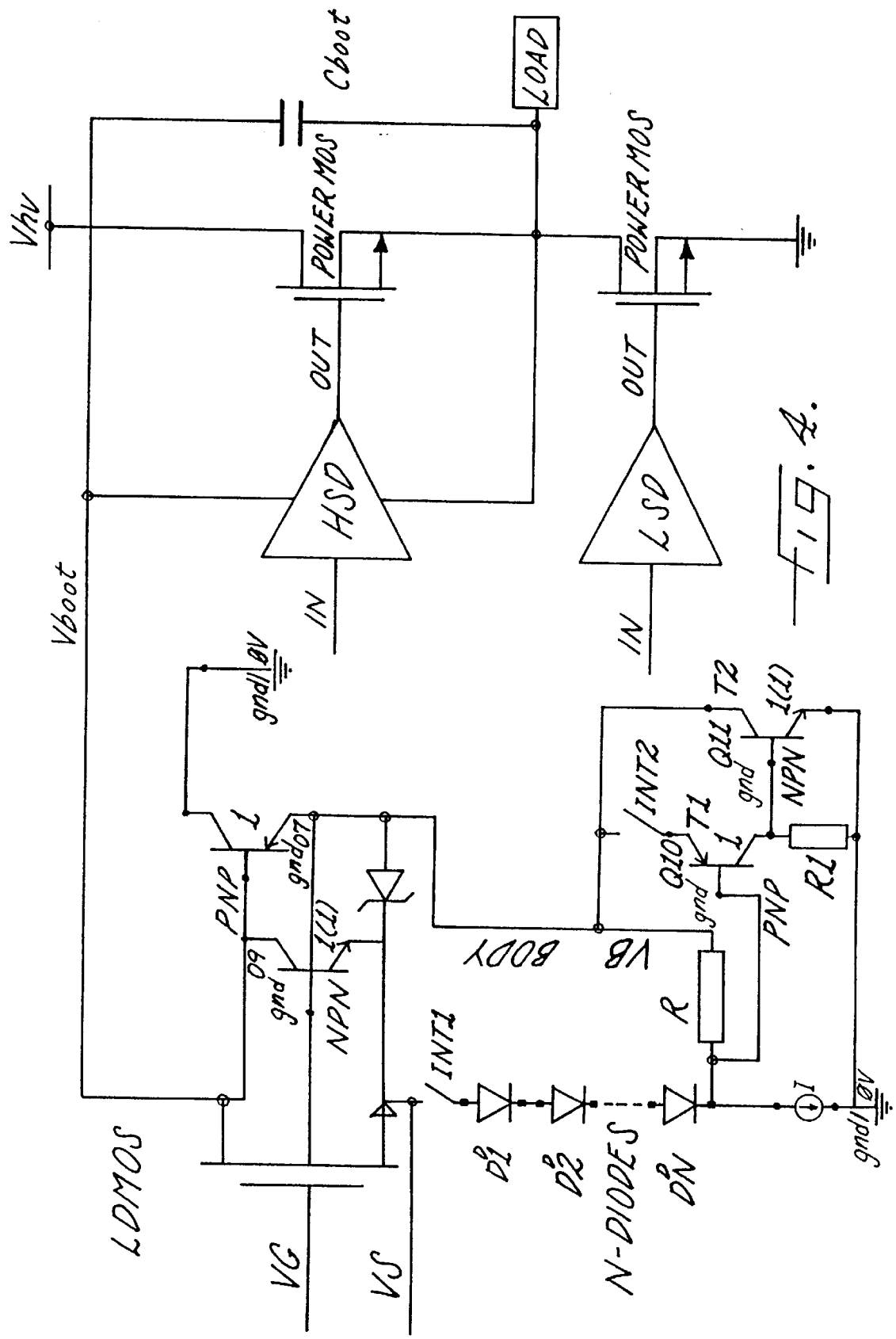
FIG. 4 shows a basic diagram of a charging circuit according to an alternative embodiment realization of this invention.

According to an alternative and preferred embodiment of this invention shown in FIG. 4, the drawbacks deriving from current injection during commutation phases through the parasitic capacitance existing between the drain and body of the LDMOS structure, which under certain operating conditions may determine the triggering-on of the parasitic NPN transistor, are effectively overcome by adding a circuit that prevents the body voltage VB from exceeding the source voltage VS plus a Vbe. This is obtained by establishing a discharge path of the body node through a transistor T2 controlled by a driving stage, made up, for example, by T1 and R1, in response to the voltage drop occurring at the terminals of the current limiting resistance R. An additional second switch INT2, driven in phase with the INT1 switch, enables the driving stage T1-R1 when the bootstrap capacitance Cboot has reached a situation of full charge.

Assuming the INT2 switch closed, if the body potential VB (initially having a value equal to Vs−nVbe) rises by just one Vbe, in other words if it reaches a value given by VS−(n−1) Vbe, during a "low" to "high" transient of the output, the PNP transistor T1 turns on turning on the NPN transistor T2 that provides a discharge path of the body potential. In this way, the source/body junction cannot become forward biased and therefore the parasitic PNP transistor does not turn on. Of course, the discharge circuit should be designed in such a way to possess an adequate commutation speed, bearing also in mind the electrical characteristics of the integrated structure of the charging LDMOS.

The function of the switch INT2 that activates the driving stage T1-R1 is that of limiting current consumption.

Indeed, during a first charging phase of the bootstrap capacitance Cboot, the body of the LDMOS transistor is kept at ground potential by using a current generator GEN. If the source voltage VS exceeds the breakdown voltage (VZ) of the body-source junction, then the body would attain the voltage given by VS−VZ due to the high impedance of the current generator GEN that is in turn connected in series to the limiting resistance R. When the circuit condition VS−VZ>Vbe is met, the discharge circuit, made up of the transistors T1 and T2 would absorb much current which in turn would leak toward the substrate. By inserting a switch INT2, that can be driven in phase with INT1, that is by keeping the switch INT2 open while INT1 is open, the transistors T1 and T2 remain turned off during the charging process of the bootstrap capacitance, avoiding any loss of current.

The control of the switch INT1 or that of the switches INT1 and INT2 together, is easily attainable by means of a simple driving circuit responding to the instantaneous value of the voltage (Vboot) present on the charging bootstrap capacitance.

Figure 5:
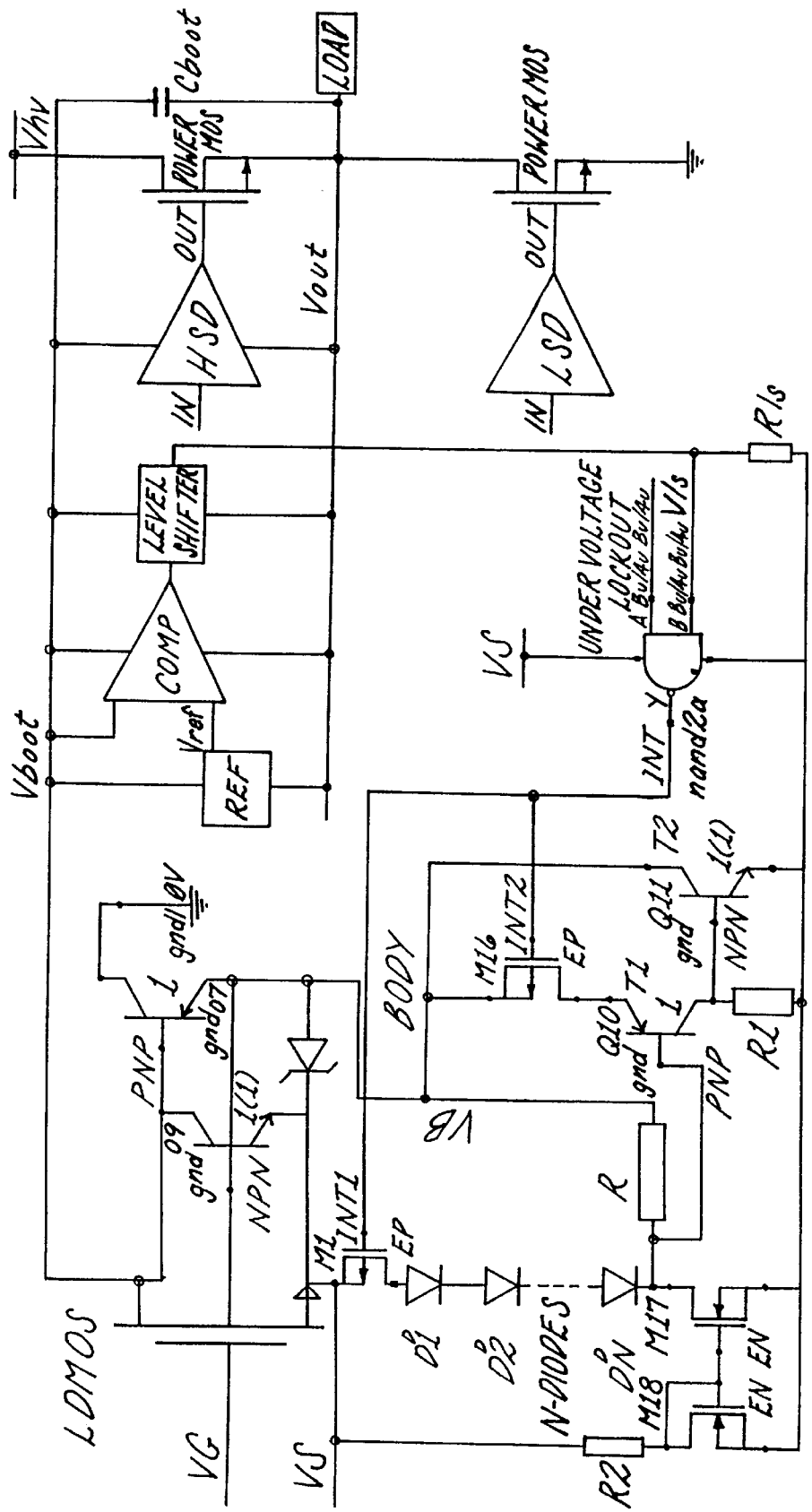
FIG. 5 is a circuit diagram of a sample embodiment of the present invention.

A sample of the circuital realization of the present invention is schematically shown in FIG. 5, the figure includes also a timing and a control circuit of the INT1 and INT2 switches. The comparator COMP senses the voltage Vboot−Vout, however, before the systems starts to commute, Vout is necessarily linked at ground potential or at a value very close to zero, therefore when Vboot>Vref (with VS−(n+1) Vbe<Vref<Vs), on the resistance Rls a logic signal going from "0" to "1" is generated. If in the instance of Vls="1", VS is such that the system can start commuting (in other words when the "under voltage lockout" signal is equal to "1"), then the two PNP transistors that implement the switches INT1 and INT2 are commanded to turn on (in other words their control gate is biased to zero potential) assuring a correct control (disabling) of the parasitic elements of the integrated LDMOS structure.

FIG. 6 shows a block diagram of a typical device for driving a push-pull power stage employing discrete power devices supplied at a voltage higher than the supply voltage of the control and driving circuitry. In FIG. 6 the thick black square outlines an integrated circuit contained in the device. In the device configuration shown in FIG. 6, during the entire stand-by phase, that is when LVG="1" and HVG="0", the bootstrap capacitance Cboot charges through the low-side power device, which is in turn referred to ground potential, and through the integrated transistor LDMOS. During switching it is positively excluded that the HVG and the LVG be simultaneously "low" or "high". The bootstrap LDMOS is turned-on in phase with the LVG pin so as to assure the restoring of the charge in the bootstrap capacitance Cboot; charge that was lost by the bootstrap capacitance during a HVG="1" and LVG="0" phase.

Evidently, the driven load (LOAD) can be the winding of an electric motor, a solenoid of an actuator, a neon lamp or the like.

We claim:

1. A charging circuit for a bootstrap capacitance having a circuit for charging the bootstrap capacitor including an integrated LDMOS transistor; and a circuital device for preventing the turning on of a parasitic transistor of the LDMOS structure during transients comprising:

a predetermined number of p-n junction diodes positioned between a source node and a body node of the LDMOS transistor; at least a current generator connected to the ground potential of the circuit and functionally connected between said body node and a ground node, at least one switch connected between said source node and a first junction of said predetermined number of p-n junction diodes, a limiting resistance connected between said body node and said current generator, and switch controlling means connected to said at least one switch for opening said at least one switch during a charging phase of said bootstrap capacitance and for closing said at least one switch when a charge voltage of the bootstrap capacitance reaches a predetermined threshold.

2. A charging circuit according to claim 1, wherein the predetermined threshold is greater or equal to a source voltage of the LDMOS minus the product of the predetermined number of diodes plus one times a base-emitter voltage of the parasitic transistor.

3. A charging circuit according to claim 1, further comprising a circuit capable of preventing the body voltage from exceeding the source voltage plus a base-emitter voltage of the parasitic transistor, by establishing a discharge path of said body enabled by a control stage in response to a voltage drop detected on said limiting resistance.

4. A charging circuit according to claim 3, wherein said at least one switch comprises a first switch, and wherein said control stage comprises a second enabling switch which is driven in phase with said first switch.

5. A charging circuit according to claim 4, wherein said first switch is driven by a control circuit responding to the charge voltage of the bootstrap capacitance.

6. A charging circuit according to claim 5, wherein said control circuit comprises a comparator, a level shifter circuit driven by the output of said comparator and capable of forcing a current through a resistance connected between the output node of said level shifter circuit and a ground node;

one logic NAND gate having a first input coupled to said resistance, a second input controlled by an enabling logic signal and an output coupled to a control terminal of said first switch.

7. A charging circuit according to claims 6, wherein the output of said logic NAND gate is coupled to the control terminals of said first and second switches.

8. An integrated circuit, comprising:
a bootstrap capacitor;
an LDMOS transistor connected to said bootstrap capacitor, said LDMOS transistor having a body node, a source node, a parasitic PNP transistor, and a parasitic NPN transistor;
a plurality of diodes located between said source node and said body node;
a current generator connected to at least one of said plurality of diodes and a ground potential and also connected between said body node and the ground potential;
a resistor connected to said body node and said current generator;
a switch located between said source node and one of said plurality of diodes; and
control circuitry connected to open said switch when charging said bootstrap capacitor, and close said switch when the voltage of said bootstrap capacitor reaches a predetermined threshold;
wherein the voltage of said body node increases when said switch is closed, without turning on either of said parasitic transistors.

9. An integrated circuit, comprising:
a bootstrap capacitor;
an LDMOS transistor connected to said bootstrap capacitor, said LDMOS transistor having a body node, a source node, a parasitic PNP transistor, and a parasitic NPN transistor,
a plurality of diodes located between said source node and said body node;
a current generator connected to at least one of said plurality of diodes and a ground potential and also connected between said body node and the ground potential;
a resistor connected to said body node and to one of said plurality of diodes;
a switch located between said source node and one of said plurality of diodes; and
control circuitry connected to open said switch when charging said bootstrap capacitor, and close said switch when the voltage of said bootstrap capacitor reaches a predetermined threshold;
wherein the voltage of said body node rises when said switch is closed, without turning on either of said parasitic transistors;
whereby said resistor functions as a current limiter when said switch prematurely closes.

10. An integrated circuit, comprising:
a bootstrap capacitor;
an LDMOS transistor connected to said bootstrap capacitor, said LDMOS transistor having a body node, a source node; a parasitic PNP transistor, and a parasitic NPN transistor;
a plurality of diodes located between said source node and said body node;
a current generator connected to at least one of said plurality of diodes and a ground potential and also connected between said body node and the ground potential;
a resistor connected to said body node and to one of said plurality of diodes;
a driving stage connected to said bootstrap capacitor, wherein said bootstrap capacitor biases said driving stage when said driving stage is driven in a turn-on mode;

a switch located between said source node and one of said plurality of diodes; and control circuitry connected to open said switch when charging said bootstrap capacitor, and close said switch when the voltage of said bootstrap capacitor reaches a predetermined threshold;

wherein a voltage of said body node rises when said switch is closed, without turning on either of said parasitic transistors;

whereby a supply of said driving stage is ensured by said bootstrap capacitor.

11. The integrated circuit of claim 10, wherein said driving stage comprises a high side driver.

12. An integrated circuit, comprising:

a bootstrap capacitor;

an LDMOS transistor connected to said bootstrap capacitor, said LDMOS transistor having a body node, a source node, a parasitic PNP transistor, and a parasitic NPN transistor;

a plurality of forward biased diodes located between said source node and said body node;

a current generator connected to at least one of said plurality of diodes and a ground potential and also connected between said body node and the ground potential;

a first resistor connected to said body node and one of said plurality of forward biased diodes;

a first switch located between said source node and one of said plurality of forward biased diodes;

discharge circuitry comprising a discharge path of said body node through a first transistor, and a driving stage, said discharge path being controlled by said driving stage, said driving stage being connected in response to the voltage drop across said resistor;

a second switch driven in phase with said first switch, said discharge circuitry being enabled by said second switch; and control circuitry connected to open said first and second switches when charging said bootstrap capacitor and to close said first and second switches when a voltage of said bootstrap capacitor reaches a predetermined threshold;

wherein a voltage of said body node rises when said first switch is closed, without turning on either of said parasitic transistors;

wherein said second switch enables said driving stage when the capacitance of said bootstrap capacitor reaches a desired charge;

whereby said second switch functions as a current limiter when said first switch prematurely closes.

13. The integrated circuit of claim 12, wherein said driving stage comprises a second transistor and a second resistor, wherein said second transistor turns on said first transistor when said second switch is closed.

14. The integrated circuit of claim 12, wherein said control circuitry further comprises a comparator connected to sense the voltage of said bootstrap capacitor.

15. A method for charging a bootstrap capacitor, comprising the steps of:

providing an LDMOS transistor connected to said bootstrap capacitor, said LDMOS transistor having a body node, a source node, a parasitic PNP transistor, and a parasitic NPN transistor;

providing a current generator connected to said body node of said LDMOS and a ground potential;

connecting a plurality of diodes between said source node and said body node;

connecting a resistor between said body node and at least one of said plurality of diodes;

providing a switch located between said source node and one of said plurality of diodes;

opening said switch when charging said bootstrap capacitor; and closing said switch when the voltage of said bootstrap capacitor reaches a predetermined threshold;

wherein a voltage of said body node rises when said switch is closed, without turning on either of said parasitic transistors.

* * * * *

UNITED STATES PATENT AND TRADEMARK OFFICE
CERTIFICATE OF CORRECTION

PATENT NO. : 5,883,547
DATED : March 16, 1999
INVENTOR(S) : Claudio Diazzi, Fabrizio Martignoni, and Mario Tarantola It is certified that error appears in the above-indentified patent and that said Letters Patent is hereby corrected as shown below:

Column 1, Line 35    Strike:    " with   stand "

Insert:    -- withstand --

Column 1, Line 63    Strike:    " $Vboot > VS = (n+1)Vbe$ "

Insert:    -- $Vboot > VS - (n+1)Vbe$ --

Signed and Sealed this

Nineteenth Day of October, 1999

Attest:

Q. TODD DICKINSON

*Attesting Officer*    *Acting Commissioner of Patents and Trademarks*